United States Patent
Liu et al.

(10) Patent No.: US 9,318,671 B2
(45) Date of Patent: Apr. 19, 2016

(54) HIGH EFFICIENCY LIGHT EMITTING DIODE PACKAGE SUITABLE FOR WAFER LEVEL PACKAGING

(71) Applicant: Toshiba Corporation, Minato-ku, Tokyo (JP)

(72) Inventors: Kai Liu, Pleasanton, CA (US); Chao-Kun Lin, San Jose, CA (US)

(73) Assignee: Toshiba Corporation, Tokyo (JP)

( * ) Notice: Subject to any disclaimer, the term of this patent is extended or adjusted under 35 U.S.C. 154(b) by 0 days.

(21) Appl. No.: 14/256,715

(22) Filed: Apr. 18, 2014

(65) Prior Publication Data
US 2015/0303359 A1 Oct. 22, 2015

(51) Int. Cl.
| | | |
|---|---|---|
| *H01L 33/00* | (2010.01) | |
| *H01L 33/58* | (2010.01) | |
| *H01L 33/50* | (2010.01) | |
| *H01L 33/54* | (2010.01) | |
| *H01L 33/56* | (2010.01) | |

(52) U.S. Cl.
CPC .............. *H01L 33/58* (2013.01); *H01L 33/507* (2013.01); *H01L 33/54* (2013.01); *H01L 33/56* (2013.01); *H01L 2933/005* (2013.01); *H01L 2933/0033* (2013.01); *H01L 2933/0041* (2013.01); *H01L 2933/0058* (2013.01)

(58) Field of Classification Search
CPC ........... H01L 2224/48091; H01L 2924/00014; H01L 2924/00; H01L 2224/73265; H01L 2924/0002; H01L 2924/12041; H01L 2924/01322; H01L 33/486; H01L 33/58; H01L 33/507; H01L 33/54; H01L 33/56; H01L 2933/0033; H01L 2933/0041; H01L 2933/005; H01L 2933/0058
USPC .......................................................... 257/98
See application file for complete search history.

(56) References Cited

U.S. PATENT DOCUMENTS

| | | | | |
|---|---|---|---|---|
| 6,871,982 | B2 * | 3/2005 | Holman et al. ................ | 362/331 |
| 7,582,915 | B2 * | 9/2009 | Hsing Chen ............ | H01L 33/60 257/98 |
| 7,748,873 | B2 * | 7/2010 | Kim et al. ...................... | 362/328 |
| 7,781,787 | B2 * | 8/2010 | Suehiro ................ | B60Q 1/2696 257/100 |
| 2011/0193056 | A1 * | 8/2011 | Wang .............................. | 257/13 |
| 2011/0291131 | A1 * | 12/2011 | Ito ........................... | H01L 33/54 257/93 |
| 2012/0097986 | A1 | 4/2012 | Ku et al. | |

(Continued)

OTHER PUBLICATIONS

Lee et al., "Emerging trend for LED wafer level packaging," Fron. Optoelectron. 2012, 5(2): 119-126.
Fan Xuejun; "Wafer Level System Packaging and Integration for Solid State Lighting (SSL);" EuroSimE 2012.
Jeung et al.; "Silicon-Based, Multi-Chip LED Package," Electronic Components and Technology Conference 2007.

(Continued)

*Primary Examiner* — Jessica Stultz
*Assistant Examiner* — Vu A Vu
(74) *Attorney, Agent, or Firm* — White & Case LLP

(57) ABSTRACT

An LED package and method for LED packaging is disclosed. In one embodiment, an LED package includes a carrier substrate having a predefined surface area, an LED device bonded to the carrier substrate, the LED device having a footprint area of at least fifty percent of the predefined surface area of the carrier substrate, and an encapsulant lens having a top surface inclined inwardly at an angle in the range of about 10° to about 140°. In one embodiment, the top surface of the encapsulant lens layer has a concave cone shape. In one embodiment, a wafer level packaging process includes forming an encapsulant lens layer portion having a top surface inclined inwardly at an angle in the range of about 10° to about 140° on each of a plurality of LED devices bonded to a carrier substrate wafer.

32 Claims, 16 Drawing Sheets

(56) References Cited

U.S. PATENT DOCUMENTS

2012/0146074 A1    6/2012  Ariizumi et al.
2013/0168709 A1*   7/2013  Lin ................................. 257/89

OTHER PUBLICATIONS

Yuan et al., Polymer-based 2D/3D Wafer Level Heterogeneous Integration for SSL Module, Eurosime 2012.

* cited by examiner

| Cone Height (mm) | Volume (mm$^3$) |
| --- | --- |
| 10 | 5.994 |
| 8 | 4.804 |
| 6 | 3.614 |
| 5 | 3.019 |
| 4 | 2.425 |
| 2 | 1.235 |
| 1 | 0.640 |
| 0.8 | 0.521 |
| 0.6 | 0.402 |
| 0.4 | 0.283 |
| 0.2 | 0.164 |
| 0.1 | 0.104 |

FIG. 7

HIGH EFFICIENCY LIGHT EMITTING DIODE PACKAGE SUITABLE FOR WAFER LEVEL PACKAGING

FIELD OF THE INVENTION

The invention relates generally to light emitting diodes and more particularly to a high efficiency light emitting diode package suitable for wafer level packaging.

BACKGROUND

FIGS. 1A-1G show the manufacturing steps for creating a conventional vertical LED (VLED) chip. In FIGS. 1A and 1B, an epitaxial growth process forms an N-type epitaxial semiconductor layer 101 on a semiconductor growth substrate 100, such as sapphire ($Al_2O_3$). In FIG. 1C, an epitaxial growth process forms a P-type epitaxial semiconductor layer 102 on top of the N-type epitaxial semiconductor layer 101. In FIG. 1D, a metal bonding layer 103 is deposited on top of the P-type epitaxial semiconductor layer 102. The metal bonding layer 103 is a conductive material, for example gold tin (AuSn), nickel tin (NiSn), copper tin (CuSn), and silicon gold (SiAu), and may comprise multiple conductive layers made of different types of conductive materials, including a mirror layer (not pictured). The mirror layer generally comprises a material having a high degree of reflectivity, for example aluminum (Al), silver (Ag), or Rhodium (Rh).

In FIG. 1E, a conventional wafer bonding process, such as eutectic bonding where heat and pressure are used to form an ohmic connection, bonds a first surface 104a of a carrier substrate 104 to the metal bonding layer 103. The carrier substrate 104 may be made of single crystal materials such as silicon, sapphire, or silicon carbide, or ceramic materials, such as aluminum nitride, silica, or metallic materials having good heat conductivity such as aluminum, copper, nickel, or alloys thereof. In FIG. 1F, the semiconductor growth substrate 100 has been removed. Removal of the semiconductor growth substrate 100 may be accomplished by any known method, including Laser Lift Off (LLO) or chemical etching. In FIG. 1G, a deposition and etching process forms an N-electrode 105 and a P-electrode 106 on opposite sides of the VLED chip. The N-electrode 105 is formed on the N-type epitaxial semiconductor layer 101 and the P-electrode 106 is formed on a second surface 104b of carrier substrate 104.

The VLED chip allows for greater light extraction efficiency than the traditional LED chip because the photons that are emitted downward from the LED to carrier substrate 104 are reflected back upwards by the metal bonding layer 103 and optional mirror layer, allowing them to escape rather than being absorbed. Other benefits of the VLED chip include improved heat dissipation and current spreading due to the use of a carrier substrate with high thermal conductivity and the vertical current flow through the LED, respectively.

An LED chip typically must be packaged before it can be used in an application. Packaging of an LED device such as a VLED chip for use in a lighting system application often includes attaching an encapsulant dome lens over the top surface of the LED device. Besides protecting the LED device, the dome lens improves the light emitting efficiency of the LED device. FIG. 2A is a cross-sectional diagram of a prior art LED package 200 having an encapsulant dome 216. LED package 200 includes a carrier substrate 210, an LED device 212, a phosphor-containing layer 214, and an encapsulant dome 216. Carrier substrate 210 is made of single crystal materials such as silicon, sapphire, or silicon carbide, or ceramic materials, such as aluminum nitride, silica, or metallic materials having good heat conductivity such as aluminum, copper, nickel, or alloys thereof. LED device 212 can be any type of light emitting diode structure, including an LED device made using a vertical chip process as described above. A metal bonding layer (not shown) bonds LED device 212 to carrier substrate 210. Phosphor-containing layer 214 is a conformal layer formed over LED device 212. Phosphor-containing layer 214 is typically a mixture of highly transparent silicone with phosphor particles therein. Phosphor-containing layer 214 modifies the wavelength of the light emitted by LED device 212 to "whiten" the light emitted by LED package 200.

Dome 216 is made of a transparent material, such as silicone, and enhances the light extraction efficiency of the device. Dome 216 is hemispherical and provides a highly directional emission pattern in which the majority of the emitted light is close to the optical axis of LED device 212. FIGS. 2B and 2C are graphs of a far-field emission pattern of the LED package 200 of FIG. 2A, in polar and Cartesian coordinates, respectively. Both FIGS. 2B & 2C show values of radiant intensity expressed as power per unit solid angle (W/sr). As can be seen in FIGS. 2B & 2C, the intensity is at a maximum near the optical axis (0°) of the LED device 212. The values in FIGS. 2B & 2C are for an LED package 200 with a LED device having a footprint of 1 $mm^2$ and a dome 216 with a radius of 4 mm.

In LED packages having a dome, the radius of dome 216 must be larger than the length 218 of LED device 212 to achieve the maximum light extraction efficiency, which means that the diameter of dome 216 must be significantly larger than the length 218 of LED device 212. Because the radius of dome 216 is larger than the length 218 of LED device 212, the footprint area of dome 216 is necessarily significantly larger, typically at least 2-3 times larger, than the footprint area of LED device 212. A dome of this size thus necessitates that carrier substrate 210 have a surface area that is also at least 2-3 times larger than the footprint of LED device 212.

While dome 216 is effective in enhancing the light extraction efficiency of LED package 200 and providing a directional emission pattern close to the optical axis, one drawback of dome 216 is that it is impractical to include formation of such a large dome in a full wafer level packaging scheme because of the large difference between the footprint of LED device 212 and the completed LED package 200. Another drawback is that such a relatively large dome requires a large volume of transparent silicone material, which is a significant portion of the manufacturing cost of the completed device.

Thus, there is a need for an LED package having an encapsulant lens that is more efficient and less expensive to manufacture than an LED package with a dome lens without sacrificing light extraction efficiency.

SUMMARY

In one embodiment, a light emitting diode (LED) package includes a carrier substrate having predefined surface area, and an LED device bonded to the carrier substrate, the LED device having a footprint area of at least fifty percent of the predefined surface area of the carrier substrate. The LED package also includes a phosphor-containing layer disposed on the LED device and an encapsulant lens having a footprint area substantially the same as the predefined surface area of the carrier substrate. The encapsulant lens has a top surface inclined inwardly toward the top surface of the LED device and has a thickness at an interior portion of at least ten percent of a thickness at a peripheral portion relative to the top surface of the LED device. In one embodiment, the encapsulant lens has a top surface inclined inwardly at an angle in the range of about 10° to about 140°. In one embodiment, the encapsulant lens has a top surface inclined inwardly at an angle in the range of about 10° to about 90°. In one embodiment, the top surface of the encapsulant lens has a concave cone shape. In another embodiment, the top surface of the encapsulant lens has a plurality of concave cone shapes. In one embodiment of the LED package, the LED device has a footprint area that is about ninety-five percent of the predefined surface area of the carrier substrate.

In one embodiment, a method for packaging an LED device includes forming an encapsulant lens layer on the plurality of LED devices, the encapsulant lens layer having a plurality of portions, each portion being an encapsulant lens having a top surface inclined inwardly toward the top surface of the LED device and having a thickness at an interior portion of at least ten percent of a thickness at a peripheral portion relative to the top surface of the LED device. The method further includes dicing the carrier substrate wafer into a plurality of LED packages such that each LED package includes an LED device with a footprint area of at least fifty percent of a surface area of a carrier substrate. In one embodiment, the top surface of each encapsulant lens is inclined inwardly at an angle in the range of about 10° to about 140°. In one embodiment, the top surface of each encapsulant lens is inclined inwardly at an angle in the range of about 10° to about 90°. In one embodiment, forming the encapsulant lens layer on each of the plurality of LED devices is performed using a compression molding process where a transparent silicone material is placed into a mold containing the carrier substrate wafer with the LED devices bonded thereon and then heated. In another embodiment, forming the encapsulant lens layer on each of the plurality of LED devices is performed using an injection molding process. In one embodiment, the method further includes bonding a carrier substrate wafer to a device wafer, the device wafer comprising a plurality of LED devices built on a growth substrate, and removing the growth substrate from the plurality of LED devices.

BRIEF DESCRIPTION OF THE DRAWINGS

FIG. 7 is a table showing the volume of silicone material in encapsulant lenses of various cone heights, according to one embodiment of the invention.

DETAILED DESCRIPTION

Figure 3A:
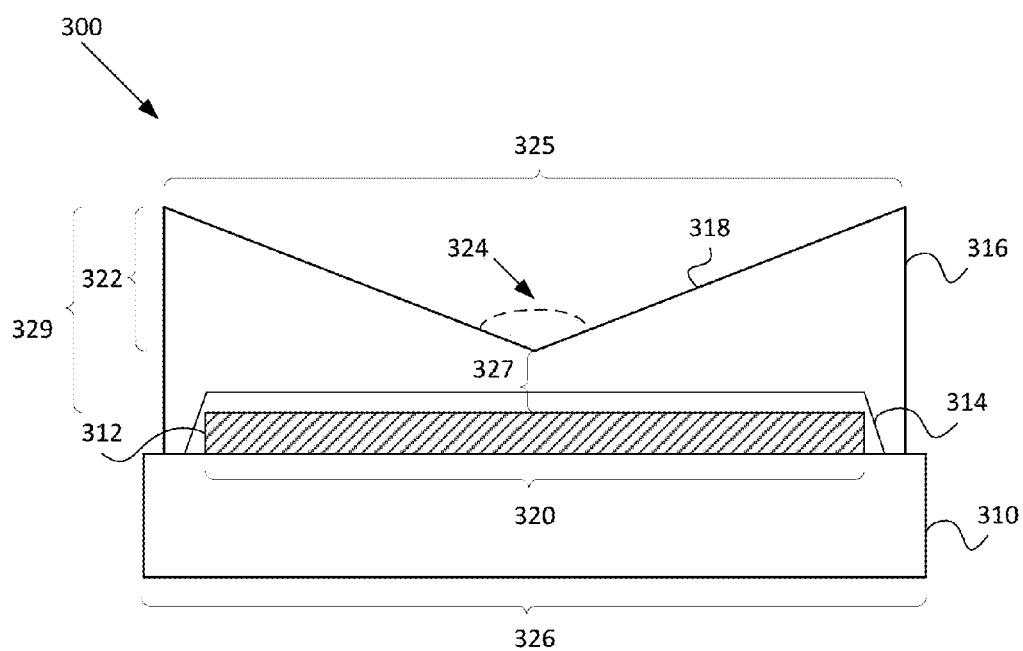
FIG. 3A is a cross-sectional diagram of one embodiment of an LED package with an encapsulant lens, according the invention.

FIG. 3A is a cross-sectional diagram of one embodiment of an LED package 300 with an encapsulant lens 316, according the invention. LED package 300 includes a carrier substrate 310, an LED device 312, a phosphor-containing layer 314, and an encapsulant lens 316. LED package 300 may also include metal contacts (not shown). Carrier substrate 310 is made of single crystal materials such as silicon, sapphire, or silicon carbide, or ceramic materials, such as aluminum nitride, silica, or metallic materials having good heat conductivity such as aluminum, copper, nickel, or alloys thereof. Carrier substrate 310 may include conductor and/or dielectric patterns such as pads, trenches, and vias, through vias filled or partially filled with conductive material, scribe lines, alignment marks, and other features (not shown). A metal bonding layer (not shown) bonds LED device 312 to carrier substrate 310. In one embodiment, carrier substrate 310 has a height in the range of 100 µm to 1000 µm (1 mm), and a length 326 in the range of 1 mm to 4 mm. LED device 312 can be any type of light emitting diode structure, including an LED made using a vertical chip process as described above in conjunction with FIGS. 1A-1G. In one embodiment, LED device 312 has a height in the range of 1 µm to 10 µm, and the edges of LED device 312 are set back 10 µm to 50 µm from the edges of carrier substrate 310. Phosphor-containing layer 314 is a conformal layer formed over LED device 312. Phosphor-containing layer 314 may be a mixture of highly transparent silicone with phosphor particles therein. Phosphor-containing layer 314 modifies the wavelength of the light emitted by LED device 312 to "whiten" the light emitted by LED package 300. In one embodiment, phosphor-containing layer 314 has a height above the surface of LED device 312 in the range of 10 µm to 100 µm. As shown in FIG. 3A, the length 326 of carrier substrate 310 is substantially the same as the length 320 of LED device 312.

Encapsulant lens 316 is made of a transparent material such as transparent silicone. A top surface 318 of encapsulant lens 316 inclines inwardly and has a concave cone shape. This shape enhances the light extraction efficiency of LED package 300. Other concave shapes that enhance the light extraction efficiency of LED package 300, including but not limited to concave shapes having a rectangular or elliptical cross-section, are within the scope of the invention. The inclination angle 324 of top surface 318 determines the light extraction efficiency and the light emission pattern of LED package 300. Inclination angle 324 is preferably in the range of 10° to 140°, and more preferably in the range of 10° to 90°. The relationship between inclination angle 324 and light extraction efficiency is discussed further below in conjunction with FIG. 5. The concave cone shape of the top surface 318 of encapsulant lens 316 enhances the light extraction efficiency by preventing a substantial portion of reflected light within encapsulant lens 316 from being absorbed back into LED device 312. Substantial portions of the light reflected by top surface 318 of encapsulant lens 316 will be further reflected by other portions of top surface 318 and the side surfaces of encapsulant lens 316 and then subsequently emitted by encapsulant lens 316 instead of being reabsorbed by LED device 312.

The height 329 of encapsulant lens 316 is the height 322 of a top portion of encapsulant lens 316 plus a distance 327 of the lowest point of top surface 318 from the top surface of LED device 312. The height 322 of the top portion of encapsulant lens 316 depends on inclination angle 324 of the top surface 318 and the footprint of encapsulant lens 316. This relationship may be expressed as:

$$H = \tan(90 - \theta/2) \cdot L \cdot \sqrt{2}/2$$

where H is height 322, θ is inclination angle 324, and L is length 325. In one embodiment, the height 322 of the top portion of encapsulant lens 316 is in the range of about 0.1 mm to about 5 mm, and the distance 327 is in the range of about 0.01 mm to about 0.1 mm T In one embodiment, distance 327 is at least ten percent of height 329. The footprint of encapsulant lens 316 is substantially the same as the surface area of carrier substrate 310. Encapsulant lens 316 covers the entire area of LED device 312 and phosphor-containing layer 314.

Figure 3B:
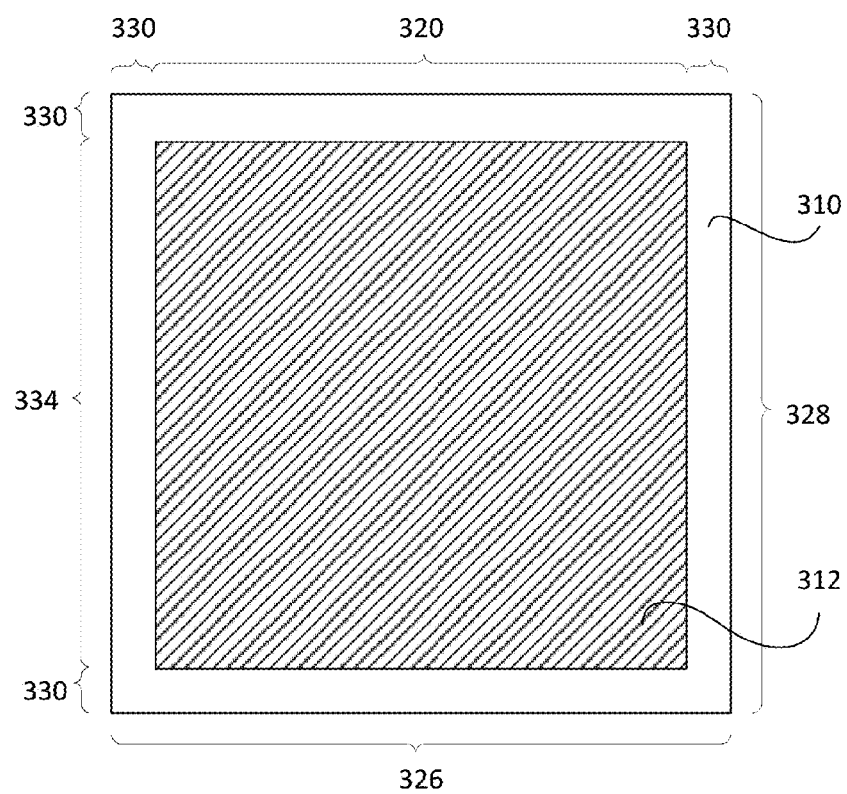
FIG. 3B is a plan view diagram of one embodiment of the LED device and carrier substrate of the LED package of FIG. 3A, according to the invention.

FIG. 3B is a plan view diagram of one embodiment of the LED device 312 and carrier substrate 310 of the LED package of FIG. 3A. Carrier substrate 310 has a width 326 and a length 328 that are substantially equal. In one embodiment, each of width 326 and length 328 is in the range of 1 mm to 4 mm. LED device 312 has a width 332 and a length 334 that are substantially equal. The edges of LED device 312 are at a set back distance 330 from the edges of carrier substrate 310. In one embodiment, set back distance 330 is in the range of 10 μm to 50 μm. As shown in FIG. 3B, the footprint area of LED device 312 is at least half (50%) of the surface area of carrier substrate 310. In one embodiment, the footprint of LED device 312 is about ninety-five percent (95%) or greater of the surface area of carrier substrate 310.

Figure 3C:
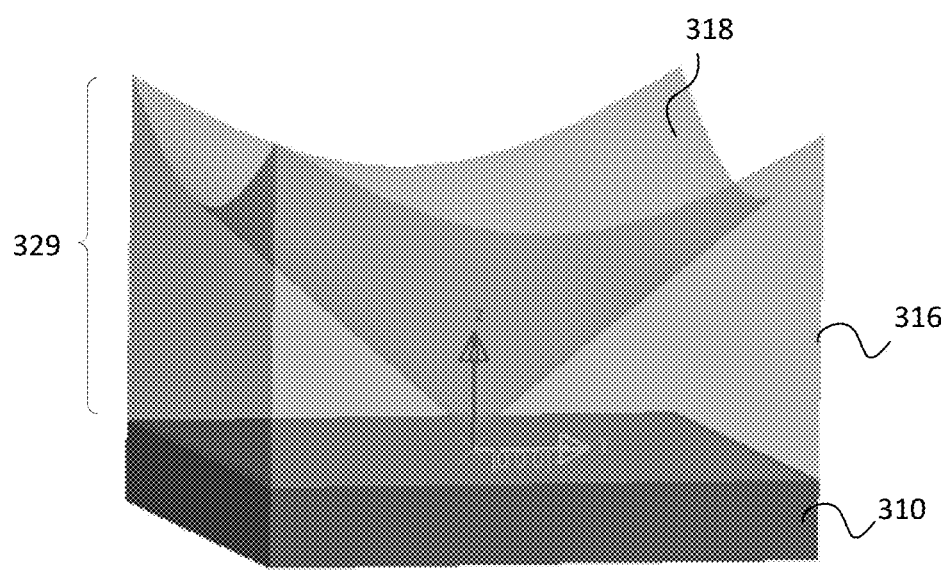
FIG. 3C is a perspective view of one embodiment of the encapsulant lens of the LED package of FIG. 3A, according to the invention.

FIG. 3C is a perspective view of one embodiment of the encapsulant lens 316 of the LED package 300 of FIG. 3A, according to the invention. In the FIG. 3C embodiment, the height 329 of encapsulant lens 316 is about 0.6 mm and the inclination angle 324 is about 100°. As shown, the concave cone shape of top surface 318 of encapsulant lens 316 is symmetrical about the z-axis.

Figure 1A:
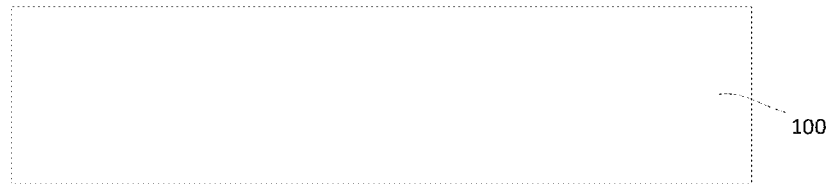
FIGS. 1A-1G are cross-sectional diagrams illustrating the manufacturing steps for creating a conventional vertical LED (VLED) chip.
Figure 1B:
Figure 1C:
Figure 1D:
Figure 1E:
Figure 1F:
Figure 1G:
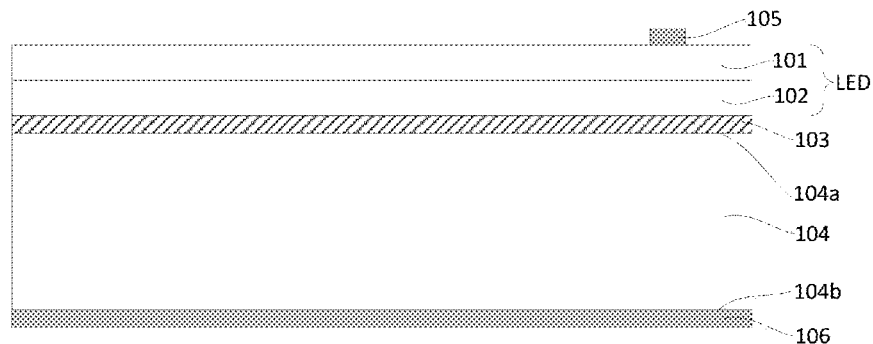
Figure 2A:
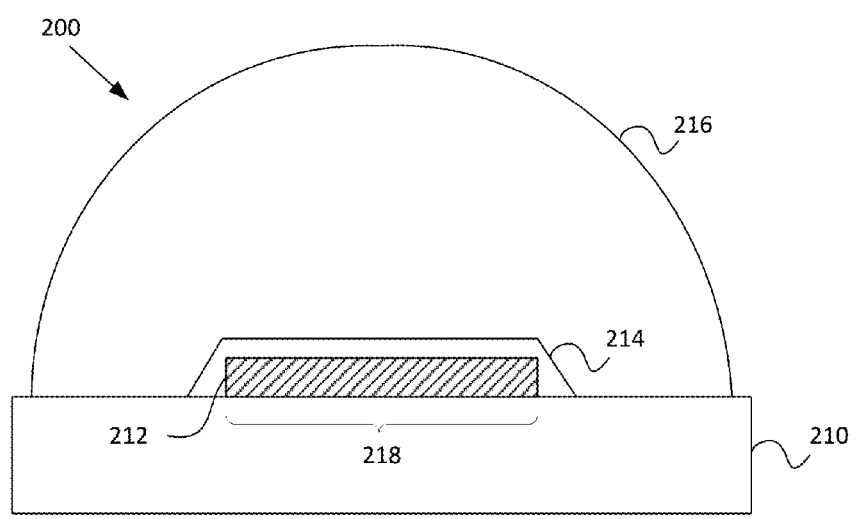
FIG. 2A is a cross-sectional diagram of a prior art LED package having an encapsulant dome.
Figure 2B:
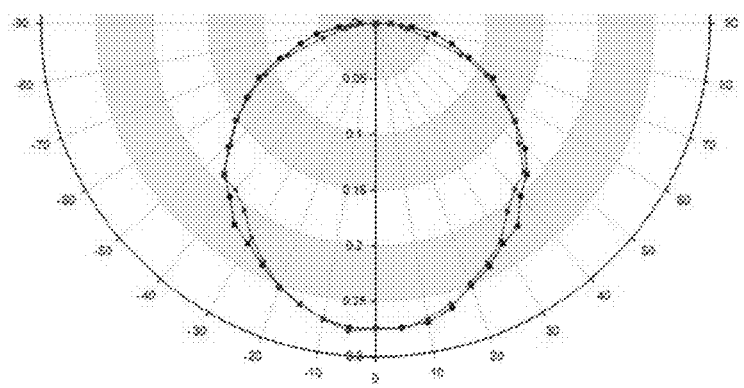
FIG. 2B is a graph of a far-field emission pattern of the prior art LED package of FIG. 2A in polar coordinates.
Figure 2C:
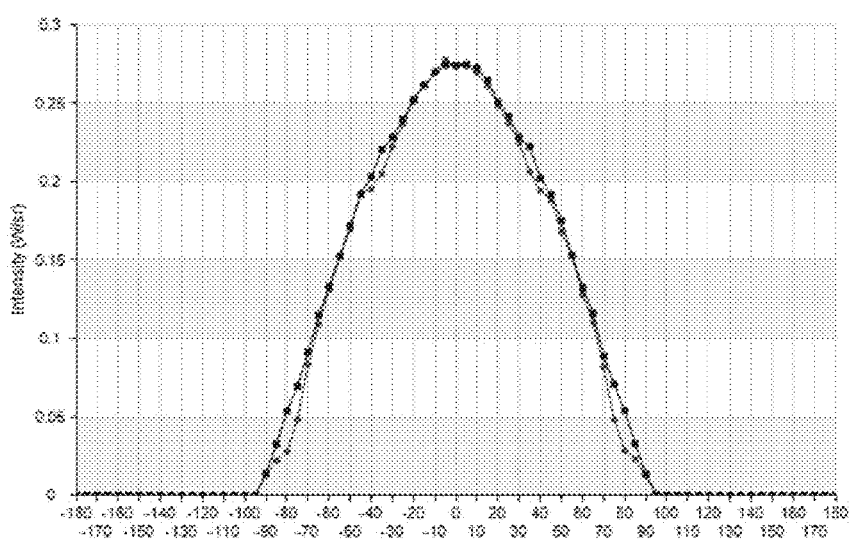
FIG. 2C is a graph of a far-field emission pattern of the prior art LED package of FIG. 2A in Cartesian coordinates
Figure 3D:
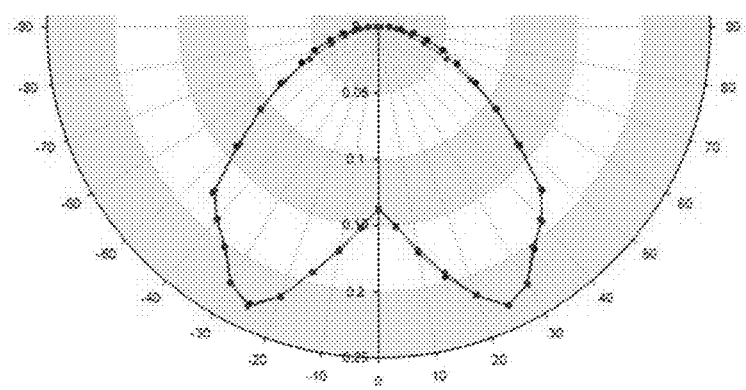
FIG. 3D is a graph of a far-field emission pattern of the LED package of FIG. 3A in polar coordinates, according to the invention.
Figure 3E:
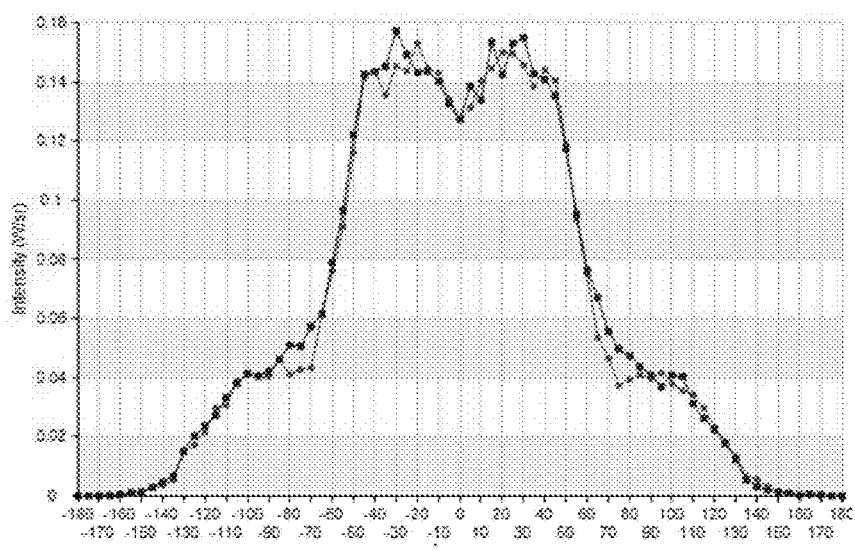
FIG. 3E is a graph of a far-field emission pattern of the LED package of FIG. 3A in Cartesian coordinates, according to the invention.

FIGS. 3D and 3E are graphs of a far-field emission pattern of the LED package of FIG. 3A in polar and Cartesian coordinates, respectively. Both FIGS. 3D & 3E show values of radiant intensity, expressed as power per unit solid angle (W/sr), for an LED package 300 with an encapsulant lens 316 having height 329 of 0.6 mm. As shown, the maximum intensity values are generally located at solid angles between ±15° and ±40°. The emission patterns of FIGS. 3D & 3E are more diffuse than the emission patterns shown in FIGS. 2B & 2C for the prior art LED package 200 having dome 216. The concave cone shape of top surface 318 of encapsulant lens 316 produces a light emission pattern that is more diffuse than the light emission pattern of LED package 200 with dome 216. The light emitted by encapsulant lens 316 will be more concentrated near the four corners of encapsulant lens 316 than at the center of encapsulant lens 316. But in many applications, for example residential lighting, a light source with a highly focused, non-diffuse emission pattern is not required or desired, and so an LED package 300 with encapsulant lens 316 having an emission pattern like that shown in FIGS. 3A & 3C will be acceptable for those applications.

Figure 4A:
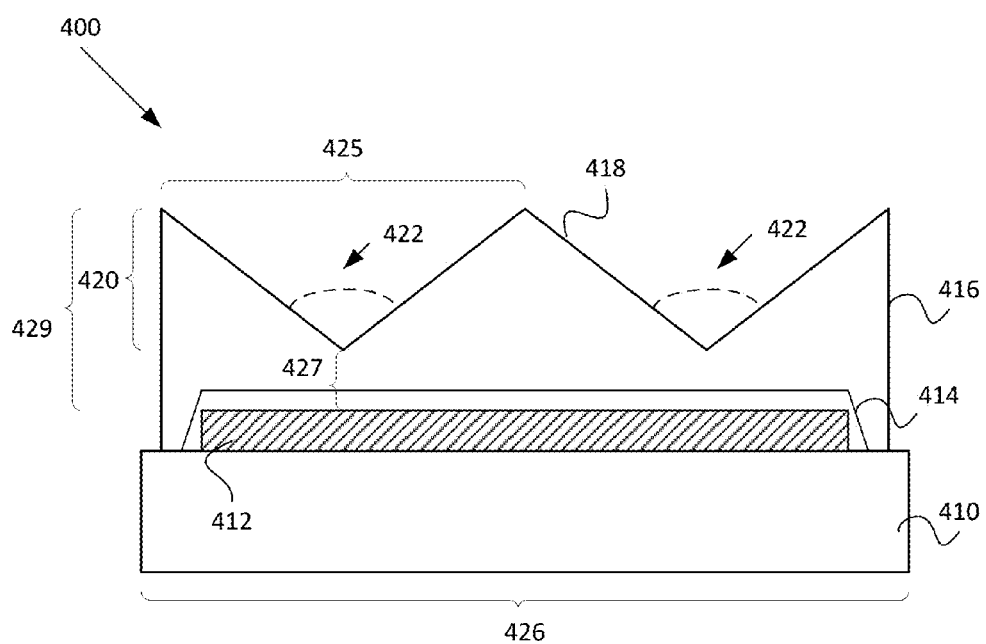
FIG. 4A is a cross-sectional diagram of another embodiment of an LED package with an encapsulant lens, according to the invention.

FIG. 4A is a cross-sectional diagram of another embodiment of an LED package 400 with an encapsulant lens 416, according to the invention. LED package 400 includes a carrier substrate 410, an LED device 412, a phosphor-containing layer 414, and an encapsulant lens 416. LED package 400 may also include metal contacts (not shown). Carrier substrate 410 is made of single crystal materials such as silicon, sapphire, or silicon carbide, or ceramic materials, such as aluminum nitride, silica, or metallic materials having good heat conductivity such as aluminum, copper, nickel, or alloys thereof. Carrier substrate 410 may include conductor and/or dielectric patterns such as pads, trenches, and vias, through vias filled or partially filled with conductive material, scribe lines, alignment marks, and other features (not shown). A metal bonding layer (not shown) bonds LED device 412 to carrier substrate 410. In one embodiment, carrier substrate 410 has a height in the range of 100 μm to 350 μm, and a length 426 in the range of 1 mm to 4 mm. LED device 412 can be any type of light emitting diode structure, including a VLED made using a vertical chip process as described above in conjunction with FIGS. 1A-1G. In one embodiment, LED device 412 has a height in the range of 1 μm to 10 μm, and the edges of LED device 412 are set back 10 μm to 50 μm from the edges of carrier substrate 410. Phosphor-containing layer 414 is a conformal layer formed over LED device 412. Phosphor-containing layer 414 may be a mixture of highly transparent silicone with phosphor particles therein. In one embodiment, phosphor-containing layer 414 has a height in the range of 10 μm to 100 μm.

Encapsulant lens 416 is made of a transparent material such as transparent silicone. A top surface 418 of encapsulant lens 416 includes a plurality of identical concave cone shapes, which enhances the light extraction efficiency of LED package 400. Other concave shapes that enhance the light extraction efficiency of LED package 400, including but not limited to concave shapes having a rectangular or elliptical cross-section, are within the scope of the invention. The inclination angle 422 of each of the plurality of concave cone shapes of top surface 418 determines the light extraction efficiency and the light emission pattern of LED package 400. Each inclination angle 422 is preferably in the range of 10° to 140°, and more preferably in the range of 10° to 90°. The plurality of concave cone shapes of top surface 418 of encapsulant lens 416 enhances the light extraction efficiency by preventing a substantial portion of reflected light within encapsulant lens 416 from being reabsorbed by LED device 412. Substantial portions of the light reflected by top surface 418 of encapsulant lens 416 will be further reflected by other portions of top surface 418 and the side surfaces of encapsulant lens 416 and subsequently emitted by encapsulant lens 416 instead of being reabsorbed by LED device 412.

The height 429 of encapsulant lens 416 is the height 420 of a top portion of encapsulant lens 416 plus a distance 427 of the lowest point of top surface 418 from the top surface of LED device 412. The height 420 of the top portion of encapsulant lens 416 depends on the number of concave cone shapes in top surface 418, the inclination angle 422 of each concave cone shape of top surface 418, and the footprint of each of the plurality of concave cone shapes in top surface 418 of encapsulant lens 416. This relationship may be expressed as:

$$H = \tan(90-\theta/2) * L * \sqrt{2}/2$$

where H is height 420, θ is inclination angle 422, and L is length 425. In one embodiment, a height 420 of the top portion of encapsulant lens 416 is in the range of about 0.1 mm to about 5 mm, and the distance 427 is in the range of about 0.01 mm to about 0.1 mm. In one embodiment, distance 427 is at least ten percent of height 429. The footprint of encapsulant lens 416 is substantially the same as the footprint of carrier substrate 410. Encapsulant lens 416 covers the entire area of LED device 412 and phosphor-containing layer 414.

Figure 4B:
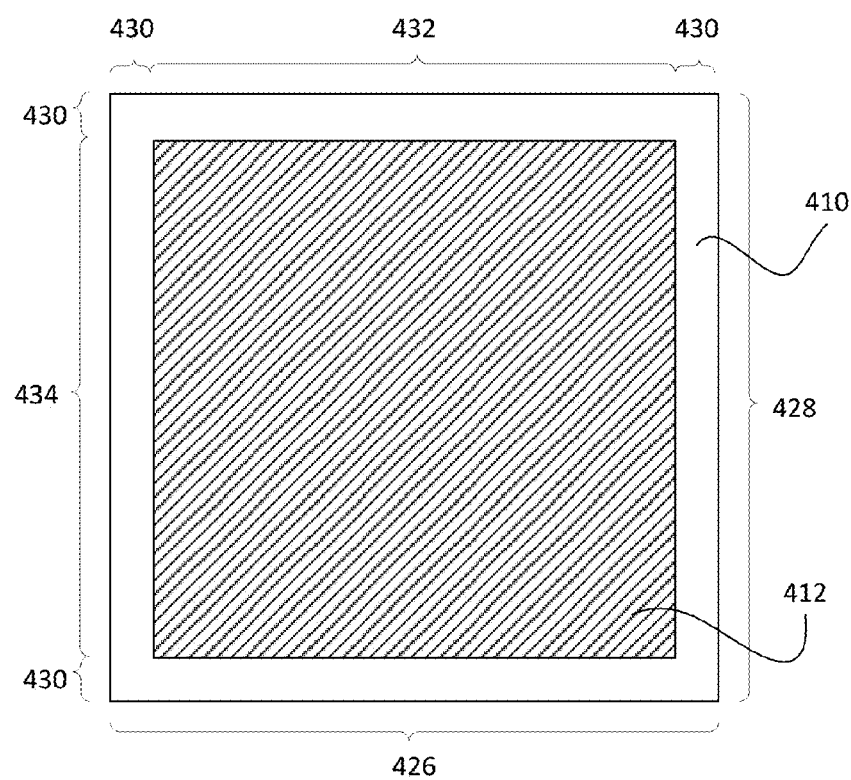
FIG. 4B is a plan view diagram of one embodiment of the LED device and carrier substrate of the LED package of FIG. 4A, according to the invention.

FIG. 4B is a plan view diagram of one embodiment of the LED device 412 and carrier substrate 410 of the LED package of FIG. 4A, according to the invention. Carrier substrate 410 has a width 426 and a length 428 that are substantially equal. In one embodiment, each of width 426 and length 428 is in the range of 1 mm to 4 mm. LED device 412 has a width 432 and a length 434 that are substantially equal. The edges of LED device 412 are at a set back distance 430 from the edges of carrier substrate 410. In one embodiment, set back distance 430 is in the range of 10 μm to 50 μm. As shown in FIG. 4B, the footprint area of LED device 412 is at least half (50%) of the surface area of carrier substrate 410. In one embodiment, the footprint of LED device 412 is about ninety-five percent (95%) or greater of the surface area of carrier substrate 410.

Figure 4C:
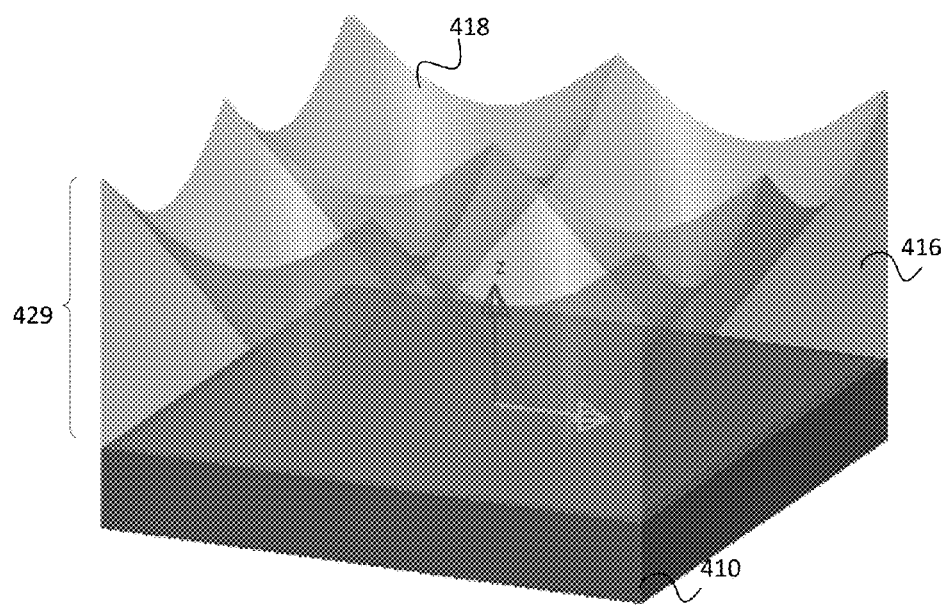
FIG. 4C is a perspective view of one embodiment of the encapsulant lens of the LED package of FIG. 4A, according to the invention.

FIG. 4C is a perspective view of the encapsulant lens of the LED package of FIG. 4A, according to the invention. As can be seen in FIG. 4C, top surface 418 includes four concave cone shapes. In other embodiments, a top surface of an encapsulant lens has a different number of concave cone shapes. The number and arrangement of concave cone shapes of the top surface will depend on the size and shape of the carrier substrate. In the FIG. 4C embodiment, the height 429 of encapsulant lens 416 is about 5 mm and each of the four inclination angles 422 is about 80°. As shown, each of the concave cone shapes of top surface 418 of encapsulant lens 416 is symmetrical about the z-axis.

Figure 4D:
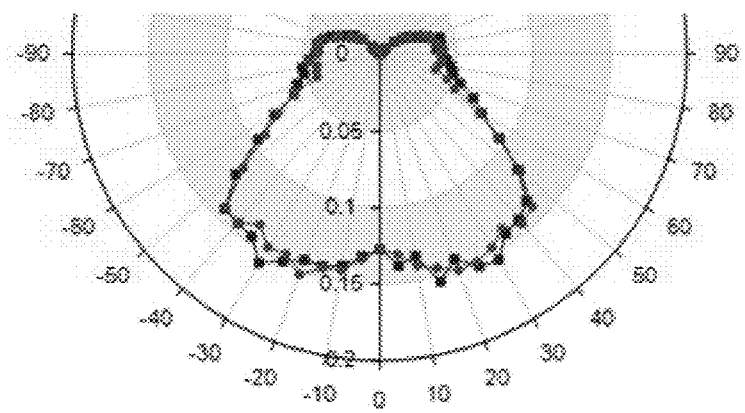
FIG. 4D is graph of a far-field emission pattern of the LED package of FIG. 4A in polar coordinates, according to the invention.
Figure 4E:
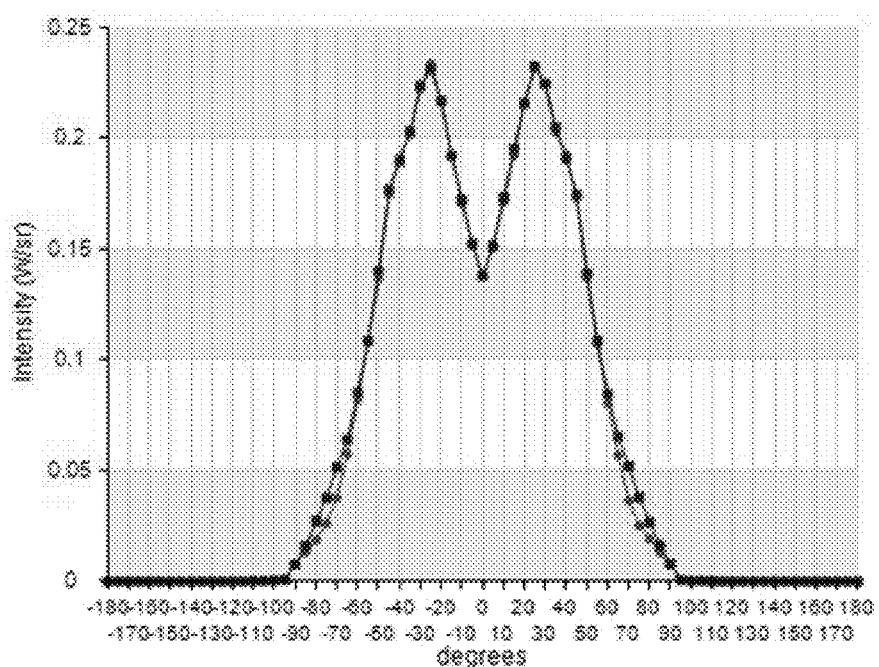
FIG. 4E is graph of a far-field emission pattern of the LED package of FIG. 4A in Cartesian coordinates, according to the invention.

FIGS. 4D & 4E are graphs of a far-field emission pattern of the LED package of FIG. 4A in polar and Cartesian coordinates, respectively. Both FIGS. 4D & 4E show values of radiant intensity, expressed as power per unit solid angle (W/sr), for LED package 400 with an encapsulant lens 416 having a height 420 of 5 mm. As shown, the maximum intensity values are generally located at solid angles between ±20° and ±35°. The plurality of concave cone shapes of top surface 418 of encapsulant lens 416 causes the light emission pattern of LED package 400 to be more diffuse than the light emission pattern of an LED package with a large dome, such as LED package 200 of FIG. 2A. But in many applications, for example residential lighting, a light source with a highly focused, non-diffuse emission pattern is not required or desired, and so LED package 400 with encapsulant lens 416 having an emission pattern like that shown in FIGS. 4D & 4E will be acceptable for those applications.

In one embodiment, encapsulant lenses 316 and 416 may be formed using a full wafer level packaging process. The basic principle of wafer level packaging is to package a plurality of devices at the same time by packaging an entire wafer before dicing the wafer into individual dies. In full wafer level packaging of LED devices, instead of individual LED dies being bonded to a carrier substrate wafer, a complete device wafer including a plurality of vertical LED devices is bonded to a carrier substrate wafer such that the LED devices are "sandwiched" between the growth substrate of the device wafer and the carrier substrate wafer. The carrier substrate wafer may include conductor and/or dielectric patterns such as pads, trenches, and vias, through vias filled or partially filled with conductive material, scribe lines, alignment marks, and other features. A eutectic metal bonding process may bond the carrier substrate wafer to the top surface of the LED device wafer. A laser lift-off or chemical etching process removes the growth substrate from the "sandwich," leaving the "flipped" un-diced LED devices bonded to the carrier substrate wafer. An etching process defines the mesas (device areas) for the individual LED devices on the carrier substrate wafer and roughens the top surface of the LED devices. Metal contacts for each of the LED devices are added to the top surface of the LED devices, the bottom surface of the carrier substrate wafer, or both. A phosphor coating may then be deposited over the LED devices on the wafer by dispensing or spraying a phosphor-containing material onto the surface of the wafer.

A compression molding process may then be used to form a lens over each of the LED devices. The wafer is placed in a mold that includes the reverse of a desired lens shape for each lens to be formed on the wafer. The wafer may include alignment marks to ensure that the mold cavities are placed accurately over each of the LED devices. A transparent silicone material preform is placed into the mold and heat is applied to melt the silicon material into the desired shape to form the lenses. In another embodiment, an injection molding process may be used where a transparent silicone material is injected into a mold placed over the carrier substrate wafer. A curing process applied to the lens mold then cures the silicone material to set the lenses and adhere them to the wafer. The curing process may include applying ultraviolet (UV) radiation, thermal radiation (infrared), microwave radiation, or other radiation that can cure the transparent silicone material. The wafer is then carefully removed from the mold so as not to cause the lenses to separate from the wafer. The wafer may now be diced into individual LED packages that each include an LED device on a carrier substrate and a lens covering the LED device.

Figure 5:
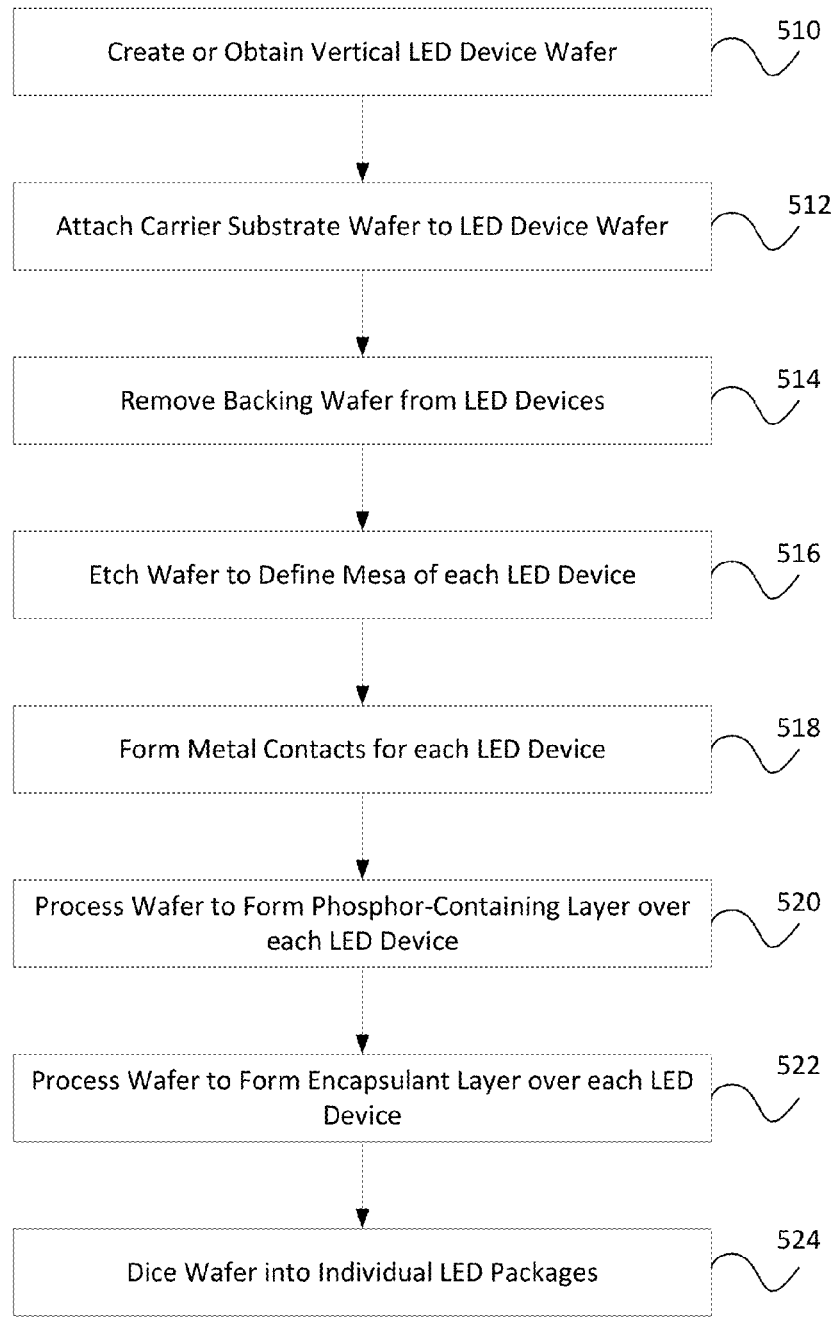
FIG. 5 is a flowchart of method steps for fabricating an LED package with an encapsulant lens using a wafer level packaging process, according to one embodiment of the invention.

FIG. 5 is a flowchart of method steps for fabricating an LED package with an encapsulant lens using a wafer level packaging process, according to one embodiment of the invention. In step 510, a device wafer including vertical LED devices formed on a growth substrate wafer is created or obtained from an LED device manufacturer. In the FIG. 5 embodiment, the mesa (device area) of each of the LED devices on the device wafer is not yet defined. In step 512, a carrier substrate wafer is attached to the exposed surfaces of the LED devices on the device wafer. The carrier substrate wafer may be made of single crystal materials such as silicon, sapphire, or silicon carbide, or ceramic materials, such as aluminum nitride, silica, or metallic materials having good heat conductivity such as aluminum, copper, nickel, or alloys thereof. The carrier substrate wafer may include conductor and/or dielectric patterns such as pads, trenches, and vias, through vias filled or partially filled with conductive material, scribe lines, alignment marks, and other features. In one embodiment, a eutectic metal bonding process attaches the carrier substrate wafer to the LED devices on the device wafer. In step 514, a laser lift-off or chemical etching process removes the backing growth substrate wafer from the LED devices, leaving the "flipped" LED devices bonded to the carrier substrate wafer. In step 516, an etching step defines the mesa (device area) of each of the LED devices on the carrier substrate wafer. The etching step also roughens the top surface of each LED device. In step 518, metal contacts for each LED device are formed on the top surface of the LED devices, on the bottom surface of the carrier substrate wafer, or both.

In step 520, a molding process forms a phosphor-containing silicone layer on each of the LED devices on the carrier substrate wafer. In other embodiments, different processes for forming a phosphor-containing layer, such as a screen printing process, dispensing process, or spray process, may be used. In step 522, a silicone compression molding process forms an encapsulant lens layer over the LED devices on the carrier substrate wafer. The encapsulant lens layer includes a plurality of portions, where each portion is an encapsulant lens formed over one of the plurality of LED devices and has a top surface with at least one concave cone shape. In one embodiment, the carrier substrate wafer and a preform of transparent silicone material are placed into the mold to form the encapsulant lens layer. The mold is configured with convex cone shapes that are the negative of the desired number of concave cone shapes with the desired inclination angle(s) for the top surfaces of the portions of the encapsulant lens layer to be formed on the LED devices. For example, if the desired encapsulant lens has a top surface including one concave cone shape with an inclination angle of about 85°, the mold will have one convex cone shape having an external angle of about 85° for each of the LED devices on the carrier substrate wafer. The compression molding process causes the silicone preform to melt and form the encapsulant lens layer. A curing process applied to the lens mold then cures the silicone material to set the encapsulant lens layer and adhere it to the LED devices and the carrier substrate wafer. The curing process may include applying ultraviolet (UV) radiation, thermal radiation (infrared), microwave radiation, or other radiation that can cure the transparent silicone material. Other silicone molding techniques, such as injection molding, may be used to form the encapsulant lens layer on the LED devices on the carrier substrate wafer. After the wafer is removed from the mold, in step 524 the wafer is diced into individual LED packages, where each LED package includes an LED device and an encapsulant lens.

Figure 6:
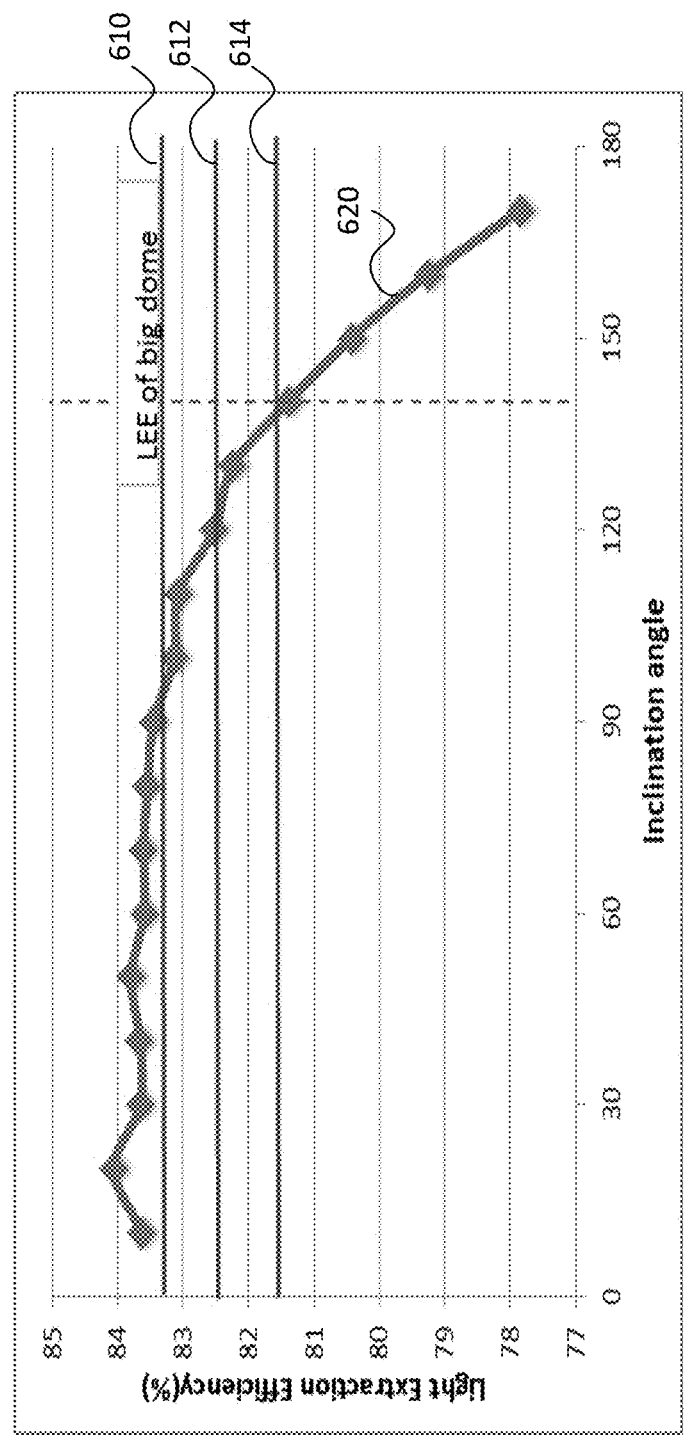
FIG. 6 is a graph showing the relationship of the angle of the top surface of the encapsulant lens of the LED package of FIG. 3A to light extraction efficiency.

FIG. 6 is a graph showing the relationship of the inclination angle of the top surface of encapsulant lens 316 of the LED package of FIG. 3A to light extraction efficiency expressed as a percentage of the light emitted by LED device 312. Line 610 represents the level of light extraction efficiency of an LED package having a dome, such as that shown in FIG. 2A, which is about 83.3%. Line 612 represents a light extraction efficiency 1% less than the efficiency of Line 610, about 82.3%. Line 614 represents a light extraction efficiency 2% less than the efficiency of Line 610, about 81.3%. Curve 620 represents the light extraction efficiency of several embodiments of LED package 300 of FIG. 3A having an encapsulant lens with a concave top surface with different angles. The values in curve 620 were determined using a ray tracing simulation for a 1 mm×1 mm LED package 300 having an encapsulant lens 316 with inclination angles of top surface 318 varying between 10° and 170°. The light extraction efficiency of an LED package 400 of FIG. 4A, having multiple concave cone shapes on top surface 418 of encapsulant lens 416, is substantially the same as the light extraction efficiency for LED package 300 shown in FIG. 6.

As shown in FIG. 6, an LED package having an encapsulant lens 316 with an inclination angle of a top surface of about 10° to about 90° has the same or slightly greater light extraction efficiency than an LED package having a dome. The light extraction efficiency is lower for inclination angles greater than 90°, but for an angle of 140° the light extraction efficiency is only about 2% lower than the light extraction efficiency of an LED package with a dome (Line 614). Thus an LED package with an encapsulant lens 316 having an inclination angle of its top surface of about 10° to about 90° provides a light extraction efficiency comparable to the light extraction efficiency of an LED package with a dome. An LED package with an encapsulant lens 316 having an inclination angle of its top surface of greater than about 90° to about 140° provides a light extraction efficiency that may be sufficiently comparable to the light extraction efficiency of an LED package with a dome for certain lighting applications.

FIG. 7 is a table showing the volume of silicone material in encapsulant lenses of various cone heights, according to one embodiment of the invention. The values shown in FIG. 7 are for encapsulant lenses having a top surface with a single concave cone shape formed on a carrier substrate with a square surface area. As shown in FIG. 7, an encapsulant lens having a cone height of 10 mm has a volume of silicone material of less than 6 mm$^3$. An encapsulant lens having a cone height of 4 mm has a volume of silicone material of 2.425 mm$^3$. In contrast, the volume of silicone required for a dome lens such as that of dome 216 of FIG. 2A with a radius (and thus a height) of 4 mm is approximately 135 mm$^3$. Thus an LED package having an encapsulant lens provides a light extraction efficiency comparable to that of an LED package with a dome yet requires significantly less silicone material than the LED package with a dome.

What is claimed is:

1. A light emitting diode (LED) package comprising:
   a carrier substrate having a predefined surface area;
   an LED device bonded to the carrier substrate, the LED device having a top surface, a footprint area of at least fifty percent of the predefined surface area of the carrier substrate, and a sidewall having a set back distance from a sidewall of the carrier substrate, wherein the set back distance is between one quarter of one percent and fifteen percent of a width of the carrier substrate; and
   an encapsulant lens formed over the LED device, the encapsulant lens having a top surface inclined inwardly toward the top surface of the LED device and having a thickness at an interior portion of at least ten percent of a thickness at a peripheral portion relative to the top surface of the LED device.

2. The LED package of claim 1, wherein the top surface of the encapsulant lens is inclined inwardly at an angle in the range of about 10° to about 140°.

3. The LED package of claim 2, wherein the angle is in the range of about 10° to about 90°.

4. The LED package of claim 2, wherein the top surface of the encapsulant lens has a concave shape.

5. The LED package of claim 4, wherein the concave shape is a cone.

6. The LED package of claim 2, wherein the top surface of the encapsulant lens has a plurality of concave shapes.

7. The LED package of claim 6, wherein each of the plurality of concave shapes is a cone.

8. The LED package of claim 1, further comprising a phosphor-containing layer disposed on a top surface of the LED device.

9. The LED package of claim 1, wherein the LED device has a footprint area of about ninety-five percent of the predefined surface area of the carrier substrate.

10. The LED package of claim 1, wherein the encapsulant lens has a footprint area substantially the same as the predefined surface area of the carrier substrate.

11. The LED package of claim 1, wherein the set back distance is in the range of ten μm and fifty μm.

12. A light emitting diode (LED) package comprising:
a carrier substrate having a predefined surface area;
an LED device bonded to the carrier substrate, the LED device having a footprint area of at least fifty percent of the predefined surface area of the carrier substrate, and a side wall having a set back distance from a side wall of the carrier substrate, wherein the set back distance is between one quarter of one percent and fifteen percent of a width of the carrier substrate; and
an encapsulant lens formed over the LED device, the encapsulant lens having a top surface shaped in such a way that the LED package is capable of emitting at least 81 percent of light emitted by the LED device.

13. The LED package of claim 12, wherein the top surface of the encapsulant lens is shaped in such a way that the LED package is capable of emitting at least about 83 percent of light emitted by the LED device.

14. The LED package of claim 12, wherein the encapsulant lens has a top surface inclined inwardly at an angle in the range of about 10° to about 140°.

15. The LED package of claim 14, wherein the angle is in the range of about 10° to about 90°.

16. The LED package of claim 12, wherein the top surface of the encapsulant lens has a concave shape.

17. The LED package of claim 16, wherein the concave shape is a cone.

18. The LED package of claim 12, wherein the top surface of the encapsulant lens has a plurality of concave shapes.

19. The LED package of claim 18, wherein each of the plurality of concave shapes is a cone.

20. The LED package of claim 12, further comprising a phosphor-containing layer disposed on a top surface of the LED device.

21. The LED package of claim 12, wherein the LED device has a footprint area of about ninety-five percent of the predefined surface area of the carrier substrate.

22. The LED package of claim 12, wherein the encapsulant lens has a footprint area substantially the same as the predefined surface area of the carrier substrate.

23. The LED package of claim 12, wherein the set back distance is in the range of ten μm and fifty μm.

24. A method for packaging a light emitting diode (LED) device, comprising:
forming an encapsulant lens layer on a carrier substrate wafer having a plurality of LED devices disposed thereon, the encapsulant lens layer including a plurality of portions, each portion disposed over one of the plurality of LED devices and each portion of the encapsulant lens layer having a top surface inclined inwardly toward the top surface of the LED device and having a thickness at an interior portion of at least ten percent of a thickness at a peripheral portion relative to the top surface of the LED device; and
dicing the carrier substrate wafer into a plurality of LED packages such that each LED package includes an LED device with a footprint area of at least fifty percent of a surface area of a carrier substrate, and a side wall having a set back distance from a side wall of the carrier substrate, the set back distance being between one quarter of one percent and fifteen percent of a width of the carrier substrate.

25. The method of claim 24, wherein forming an encapsulant lens layer includes compression molding a transparent silicone material.

26. The method of claim 24, wherein forming an encapsulant lens layer includes injection molding a transparent silicone material.

27. The method of claim 24, wherein forming an encapusulant lens layer includes each portion of the encapsulant lens layer having a top surface inclined inwardly at an angle in the range of about 10° to about 140°.

28. The method of claim 24, wherein forming an encapsulant lens layer includes each portion of the encapsulant lens layer having a top surface inclined inwardly at an angle in the range of about 10° to about 90°.

29. The method of claim 24, further comprising dicing the carrier substrate wafer into a plurality of LED packages such that each LED package includes an LED device with a footprint area that is about ninety-five percent of the surface area of a carrier substrate.

30. The method of claim 24, further comprising:
bonding a carrier substrate wafer to a device wafer, the device wafer comprising a plurality of LED devices built on a growth substrate; and
removing the growth substrate from the plurality of LED devices to produce the carrier substrate wafer having the plurality of LED devices disposed thereon.

31. The method of claim 24, the encapsulant lens having a footprint area substantially the same as the predefined surface area of the carrier substrate.

32. The method of claim 24, wherein the set back distance is in the range of ten μm and fifty μm.

* * * * *